United States Patent [19]

Martin

[11] 4,355,087

[45] Oct. 19, 1982

[54] COLOR IMAGING DEVICE HAVING A COLOR FILTER ARRAY USING A METAL SALT OF A LONG-CHAIN FATTY ACID AS A BARRIER

[75] Inventor: Thomas W. Martin, Rochester, N.Y.

[73] Assignee: Eastman Kodak Company, Rochester, N.Y.

[21] Appl. No.: 299,371

[22] Filed: Sep. 4, 1981

[51] Int. Cl.³ .................................................. G03F 5/00
[52] U.S. Cl. ........................................ 430/7; 430/274; 430/289; 430/293; 430/294; 430/321; 430/374; 350/316
[58] Field of Search .................... 430/7, 274, 289, 293, 430/294, 321, 374; 350/162 SF, 316

[56] References Cited

U.S. PATENT DOCUMENTS

| | | |
|---|---|---|
| 3,623,794 | 11/1971 | Brown .......................... 350/162 SF |
| 3,771,857 | 11/1973 | Thomasson et al. ................ 350/316 |
| 4,081,277 | 3/1978 | Brault et al. ........................ 430/200 |
| 4,169,009 | 4/1980 | Martin et al. ............................ 430/7 |
| 4,236,098 | 11/1980 | Horak et al. ............................ 430/7 |
| 4,311,773 | 1/1982 | Kaneko ................................ 430/289 |

Primary Examiner—J. Travis Brown
Attorney, Agent, or Firm—John R. Everett

[57] ABSTRACT

A color imaging device having a certain color filter array is disclosed. The color filter array is of the "wash-off" type wherein the individual filter elements are formed by dyeing tiny elements of a dyeable composition. In order to form a barrier so that the process of dyeing subsequent filter elements does not affect a previous set of filter elements, the first set of filter elements is treated with a metal salt of a long-chain fatty acid. The dyeable composition comprises at least one compound having coordination sites for the metal of the long-chain fatty acid salt.

14 Claims, No Drawings

COLOR IMAGING DEVICE HAVING A COLOR FILTER ARRAY USING A METAL SALT OF A LONG-CHAIN FATTY ACID AS A BARRIER

FIELD OF THE INVENTION

The present invention relates to color imaging devices and to methods for making them. More particularly, the present invention relates to the color filter array for the device. The color filter array of the present invention is of the "wash-off" type as described below. A metal salt of a long-chain fatty acid serves as a barrier to protect previously formed sets of filter elements.

DESCRIPTION RELATIVE TO THE PRIOR ART

Many of the early methods of color photography operated by virtue of an additive color screen or color filter array in registration with a suitable silver image. In these methods, a silver image is formed by imagewise-exposing a silver halide layer through the screen so as to produce a color image record. The silver halide layer is then developed so as to produce a positive image corresponding to the color image record. This silver image, when viewed in proper registration through the same screen, produces a color reproduction of the original image. This additive photographic process has been used to produce a diffusion transfer transparency material.

Recently, the additive photographic process has been adapted to produce what are called "single-site" color imaging devices. In a device of this type, a color filter array is registered with an array of panchromatically sensitive elements in the solid-state device. The solid-state imaging device is typically formed from a silicon wafer. The surface of the wafer is processed to produce a number of arrays of solid-state photosensitive areas sometimes called pixels. By proper selection of the color of the individual filter elements in the color filter array which is registered with this solid-state device, a color image can be extracted from a single solid-state device.

It is well-known to use dichromated gelatin in the preparation of the additive color screens for a color imaging device. (See, generally, Friedman, *History of Color Photography*, American Photographic Publishing Co, 1944, chapter 13.) In a typical process, a support is coated with a dichromated gelatin composition. The resulting layer is then exposed in those areas where it is desired to have the individual color filter elements, and the layer is processed to wash off unwanted areas of the gelatin layer. The resulting gelatin elements in the form of stripes or islands in the desired size and shape are then dyed with a suitable dye solution to form a set of color filter elements. This process is repeated to produce a multicolor filter array. This process has been used to produce an additive color screen for a diffusion transfer transparency material. (See, for example, U.S. Pat. No. 3,284,208 to Land.) It is known to provide a barrier layer, made from a dye-impermeable material, over each successive set of elements to eliminate substantially the problem of dye contamination or dye leaching when other sets of elements are subsequently dyed. Where dichromated gelatin is used as the "wash-off" composition, the barrier is most commonly nitrocellulose.

Another method which has been suggested to reduce dye contamination or dye leaching is to harden the hydrophilic colloid during or after the dyeing step. For example, in U.S. Pat. No. 3,319,226 issued Jan. 28, 1975, to Fielding et al., there is described a method whereby hydrophilic colloids are dyed by contacting them with an aqueous solution which includes a basic dye and zirconium acetate. The zirconium acetate functions as a hardener for the colloid, "locking" the dye within the colloid binder. It is also known that gelatin can be hardened by heating.

While the barrier-layer approach to protecting the dyed filter elements can be used successfully, this approach is fairly complicated. The formed filter elements must be carefully coated with a solution, which composition must be carefully controlled in terms of concentration, viscosity of the barrier-layer material and the like. Furthermore, when applied to color filter arrays for solid-state imaging devices, conventional barrier-layer materials pose other problems. For example, a three-color filter array having filter elements which are extremely small can be difficult to form using conventional barrier layers such as nitrocellulose, because the solvent used in the second applied barrier layer can dissolve the first applied barrier layer, thereby causing the individual filter elements in the first set to "float" out of position. Furthermore, conventional barrier layers must be coated over the entire surface of the solid-state imaging device, thereby interfering with electrical contacts which must be made to the surface of the device.

Many of the problems associated with conventional barrier layers have been overcome by providing a photocrosslinkable barrier layer. This approach is described in *Research Disclosure* 19420, Volume 194, June, 1980. While the provision of a photocrosslinkable barrier overcomes many of the problems associated with conventional barrier layers, such as filter-element float and electrical contact, this layer must be carefully applied and carefully exposed in order to be effective. This complicates the process for making the color filter arrays.

Hardening of the dyeable composition poses other problems. Particularly where filter elements of very precise dimension are needed, such as in the preparation of filter arrays for solid-state imaging devices, hardening is undesirable because it generally causes dimensional changes in the dyed filter elements. Hardening, either with chemical hardeners or with heat, frequently causes shrinking of the filter element to an undesirable degree.

There is a continuing need to provide color filter arrays for color imaging devices which are simply made. In the area of providing resistance to subsequent dyeing of a formed filter element set, there is a need for a simple process which does not adversely affect the dimensions of the formed filter elements.

SUMMARY OF THE INVENTION

It has been found that it is desirable to treat dyed dyeable composition with a metal salt of a long-chain fatty acid to prevent subsequent dyeing or leaching of dye from the dyeable composition. The dyeable composition is selected so that it contains a compound which has coordination sites which coordinate with the metal of the metal salt of a long-chain fatty acid. While the mechanism is not completely understood, it is believed that the metal of the metal salt of a long-chain fatty acid coordinates with the coordination sites of the dyeable composition and that the hydrophobic "tail" of the long-chain fatty acid prevents subsequent dyes from reaching the dyeable composition. Whatever the protection mechanism, the metal salt of the long-chain fatty acid reacts only with the outermost surface of the dyeable composition, that is, the surface of the element not in contact with the support, and does not harden the bulk of the dyed dyeable composition which makes up the individual filter elements.

Thus, in one aspect of the invention there is provided a color imaging device comprising a support having a radiation-sensitive surface having superimposed thereon a color filter array. The color filter array has at least two sets of filter elements wherein the filter elements comprise a dyed element of a dyeable composition. The dyeable composition comprises at least one compound having coordination sites for metal ions. The outermost surface of the elements of at least one set of filter elements comprise a metal salt of a long-chain fatty acid wherein the metal of the salt is coordinated to the coordination sites in the dyeable composition.

In another aspect of the present invention, there is provided a method of producing a color imaging device as described above. The method comprises the steps of:

(1) forming on the surface of the support a layer of a radiation-sensitive dyeable composition which comprises at least one compound having coordination sites for metal ions;

(2) exposing and developing the radiation-sensitive dyeable composition so as to form elements of the composition corresponding to a set of filter elements;

(3) dyeing the elements to form dyed filter elements;

(4) contacting the surface of the dyed filter elements with a metal salt of a long-chain fatty acid; and (5) forming a second set of color filter elements by repeating steps (1), (2) and (3) above.

The photosensitive composition which is used to form the elements of dyeable composition optionally contains an auxiliary component which functions to provide the coordination sites for the metal ions. However, the preferred dyeable composition is a hydrophilic colloid such as gelatin or a gelatin-like material, and these materials themselves have coordination sites for metal ions. Thus, when these compositions are used, a separate component for providing coordination sites for metal ions is unnecessary.

While any dye can be used to dye the dyeable composition as described above, the preferred dyes are what are referred to in the art as "reactive" dyes. Reactive dyes are those dyes which have groups which are capable of reacting with the dyeable composition to form a covalent bond.

The process of the invention greatly simplifies the preparation of color filter arrays, particularly color filter arrays which are used for solid-state color imaging devices. The metal salt of the long-chain fatty acid is deposited on the surface of the device only in those areas which contain the dyeable composition. Thus, areas which do not have the dyeable composition, such as the bonding pad areas on a solid-state color imaging device, remain substantially free from the metal salt. Furthermore, because the metal salt of the long-chain fatty acid reacts only with the surface of the dyeable composition, the individual filter elements which are formed from this dyeable composition remain substantially dimensionally stable throughout the process. There is no contracting of the elements such as occurs during a conventional chemical or heat-treatment hardening.

DETAILED DESCRIPTION OF THE INVENTION

According to the present invention, the surface of certain dyed dyeable compositions is treated with a metal salt of a long-chain fatty acid. The metal of the salt is selected so that it is capable of coordinating with coordination sites in the dyeable composition. Useful metals include the transition metals, particularly chromium. Useful long-chain fatty acids include acids having an alkyl chain of from 10-30, preferably 12-22 carbon atoms. Examples include myristic and stearic acids. Illustrative metal salts of long-chain fatty acids include chromium myristate and chromium stearate.

The surface of the individual filter elements which are made of the dyeable composition are treated by immersing or otherwise contacting the surface with a solution of the metal salt of the long-chain fatty acid. While any solvent which is capable of dissolving the metal salt of the long-chain fatty acid is useful, water solutions are preferred. The concentration of metal salt of the long-chain fatty acid in the solution is not critical. While higher and lower concentrations are useful, concentrations within the range of 1 to 10 g/liter are preferred.

Preferred metal salts of long-chain fatty acid include those commercially available under the name Quilon ® from duPont Co. Quilon ® is a chrome Werner complex in which a $C_{14}$–$C_{18}$ fatty acid is coordinated with trivalent chromium.

The photosensitive dyeable composition which is used in the color filter arrays according to the invention contains at least one component which has sites which are capable of coordinating with the metal ion of the metal salt of the long-chain fatty acid. The photosensitive composition generally comprises a polymer which itself is photosensitive or a polymer which is mixed with a sensitizer. If the polymer itself is photosensitive, it usually contains sites which crosslink the polymer when the sites are exposed to activating radiation such as UV radiation. If the polymer is mixed with a separate sensitizer, the polymer is preferably a natural colloid such as gelatin, and the sensitizer is a dichromate compound. In either case, the polymer itself usually contains the coordination sites for the metal ion or another component is mixed with the photosensitive composition to provide the coordination sites.

The coordination sites in the photosensitive polymer, hydrophilic colloid or separate component are selected such that they are capable of coordinating with the metal ion of the metal salt of the long-chain fatty acid. Thus, the particular coordinating sites will depend upon the particular metal ions selected. Useful coordinating sites include carboxyl and amino groups.

Particularly preferred dyeable compositions include hydrophilic colloids, such as gelatin, which are sensitized with a dichromate. Other useful hydrophilic colloids include fish glue, gum arabic, poly(vinyl alcohol) and the like. Useful dichromates include ammonium or sodium dichromate.

The preferred hydrophilic colloid, as mentioned above, is gelatin. Gelatin is generally made from collagen-containing materials such as bovine skin, bovine cartilage, calfskin, pigskin and the like. Methods of preparing gelatin are well-known in the art and are described, for example, by R. J. Croome and F. G.

Clegg, *Photographic Gelatin*, The Focal Press, London, 1965, and A. Veis, *The Macromolecular Chemistry of Gelatin*, Academic Press, New York, 1964.

The dyeable dichromated hydrophilic colloid compositions optionally contain other components such as hardeners such as aldehyde hardeners, inorganic hardeners such as chromium salts, alginic acid esters such as guanadine, gelatin substitutes and modifiers such as poly(vinyl alcohol) and poly(vinyl pyrrolidone), and other components which do not interfere with the photosensitive properties of the dichromated hydrophilic colloids.

One particularly useful additional component is a latex polymer. The latex polymers are added to give the dichromated gelatin compositions improved resolution and adhesion. The latex polymers which are added to the dichromated hydrophilic colloid photosensitive compositions are derived from monomers which form water-insoluble homopolymers and a small amount of monomers which form water-soluble homopolymers. These improved photosensitive compositions are described in U.S. Pat. No. 4,264,706 by Sutton and Martin issued Apr. 28, 1981.

Another useful photosensitive dyeable composition which is capable of being treated with the metal salts of the long-chain fatty acids according to the invention comprises a diazo resin and a mordant for anionic dye. These compositions are described in "Continuous-Tone Dyed Diazo Imaging Elements", *Research Disclosure*, Vol 169, item 16976, May, 1978. *Research Disclosure* is published by Industrial Opportunities, Ltd, Homewell, Havant, Hampshire, P09IEF, UK.

An auxiliary component is optionally added to a dyeable composition which otherwise does not have coordination sites for the metal ions or does not have sufficient coordinating sites so that enough of the metal salt coordinates to the surface to provide for protection from subsequent dyeing steps. That auxiliary component should have coordinating sites for the metal salt of the long-chain fatty acid. Useful auxiliary components include latex polymers which contain the coordination sites and polymeric mordants.

Useful dyes are selected based on the selection of the dyeable composition. Where the dyeable composition comprises a hydrophilic colloid such as gelatin, useful dyes include acid and basic dyes. Hydrophilic colloids are also dyed by treating the hydrophilic colloid with a metal salt and then treating it with a solution of a metalizable dye.

One particularly suitable class of dyes for dyeing hydrophilic colloids, such as gelatin, is the reactive dye. Reactive dyes are those dyes which have a group which is capable of reacting with a site in the photosensitive dyeable composition, thereby forming a covalent bond. These reactive groups generally react with the amino groups in gelatin to form a highly stable dyed filter element. Examples of suitable reactive groups are well-known in the art and are described, for example, in U.S. Pat. No. 3,884,626, column 1, line 39, through column 3, line 45, and in U.S. Pat. No. 3,669,608, column 3, line 50, through column 4, line 69. These references also disclose dyes which contain the reactive groups which are useful in the color filter arrays according to the present invention.

Reactive dyes are well-known in the art and are commercially available. Useful dyes are available under the name Drimarene TM available from Sandoz Color and Chemicals, Inc, Remazol TM available from American Hoechst Corp and Procion TM available from ICI United States, Inc.

According to the process of the present invention, a color imaging device is made by superposing a color filter array on a radiation-sensitive surface. The color filter array is optionally made on a separate support which is then superimposed on the radiation-sensitive surface or, preferably, it is formed directly on the radiation-sensitive surface. The color filter array is made by first coating a layer of a photosensitive dyeable composition which contains coordinating sites for metal ions. This photosensitive dyeable composition is then exposed and developed, resulting in stripes corresponding to a set of filter elements. These stripes are then dyed to produce the individual filter elements. Prior to the formation of a subsequent set of filter elements, the first formed filter elements are treated with a metal salt of a long-chain fatty acid. Additional sets of filter elements are then formed without affecting the previously formed filter elements.

The first step in the preferred process for forming the color imaging device according to the present invention is to coat a layer of the photosensitive dyeable composition on a radiation-sensitive surface. Preferably, the radiation-sensitive surface comprises an array of solid-state charge-handling photosensors. While a variety of methods can be used to coat the photosensitive dyeable composition, such as spray coating, air knife coating and the like, the preferred method is to spin-coat a solution of the photosensitive dyeable composition on the surface of the solid-state imaging device. It is generally desirable to maintain the thickness of the coated photosensitive dyeable composition below about 10 microns.

Following coating and drying of a layer of the photosensitive dyeable composition, the layer is exposed through a color mask which represents the negative of the desired color filter set. Areas which have been exposed and which correspond to the individual filter elements become insoluble during this exposure step. The exposure is made with light to which the photosensitive composition is sensitive, generally UV radiation. After the photosensitive layer is exposed, it is rinsed in a solvent for the composition to remove the insoluble material from areas other than the filter-element areas and then dried. If a hydrophilic colloid such as dichromated gelatin is used as the photosensitive dyeable composition, water is preferably used in this rinsing step. The result is an array of dyeable elements which correspond to the desired set of filter elements.

The dyeable elements are then dyed in order to produce individual filter elements. If a hydrophilic colloid is the dyeable material, and a reactive dye is used, this dyeing step is conveniently carried out by simply immersing the layer in a water solution of the reactive dye. In these preferred embodiments, where dichromated gelatin is used with reactive dyes, the pH of the dye solution is selected so as to promote the rapid dyeing of the dichromated gelatin. Reactive dyes with reactive groups containing aromatic ring structures are most reactive with dichromated gelatin in the pH range of about 2.0 to 3.0. Dyes with a sulfato ethyl sulfonyl group are most reactive at a pH of about 5.0. For a given dye and a given dyeable composition, the optimum pH can be determined by simple experiment. The concentration of dye in the dyeing solution varies over a wide range. Generally, the dye concentration is above about 2 g/100 mL up to the solubility limit of the dye, although lower concentrations are useful. Usually, dyeing is complete in about 20 seconds to about 8 minutes. Temperatures above room temperature are sometimes useful in this dyeing step.

After one set of color filter elements is formed and dried, these filter elements are then protected with a barrier comprising the metal salt of the long-chain fatty acid. This barrier is conveniently formed by simply contacting the surface of the formed color filter elements with a solution comprising the metal salt of the long-chain fatty acid. As previously mentioned, the concentration of the metal salt of the long-chain fatty acid in the solution which is contacted with the formed color filter elements is not critical. The surface of the formed color filter elements is conveniently contacted with the solution by simply immersing the filter elements in the solution. Generally, immersion in the solution for about 10 to about 30 seconds is sufficient, although shorter and longer times are useful. After this treatment is complete, the layer of the dyeable composition is dried such as by spin-drying, and then further dried by placing in an oven at a moderate temperature. By "moderate" is meant a temperature which will not adversely affect the dyed element. Temperatures in the range of 90° to 120° C. are useful, although higher and lower temperatures are also useful. Additional sets of color filter elements are formed by repeating the process beginning with the step of coating the photosensitive dyeable composition. During the subsequent dyeing steps, the barrier comprising the metal salt of the long-chain fatty acid protects the previously formed color filter elements from dye contamination and dye leaching.

A color filter array as described is superimposed with a radiation-sensitive surface. Any radiation-sensitive surface is useful to form the color imaging device of the invention. The radiation-sensitive surface is, for example, a silver halide layer, a photoconductive layer or the surface of a solid-state imaging device. The surface of a solid-state imaging device contains radiation-sensitive areas which are referred to in the art as charge-handling semiconductive photosensors. Examples of these photosensors include charge-coupled devices (also known as charge-coupled imagers, charge-transfer devices, charge-transfer imagers and the like), charge-injection devices, bucket-brigade devices, diode arrays and combinations of these. Useful solid-state imaging devices are described, for example, in U.S. Pat. No. 3,801,884.

If the radiation-sensitive surface is the surface of a solid-state imaging device, the color filter array according to the invention must be in microregistration with the underlying array of photosensors. As used herein, the term "microregistration" means that the filter array and the photosensor array are precisely aligned on a micron scale. In other words, the position of the filter array is less than about 1 micron away from its intended position with respect to the photosensor array. Further, each filter element is less than about 1 micron away from its intended position in the filter array.

Solid-state color imaging devices which are useful with color filter arrays as described herein are well-known in the art. A detailed description is found in U.S. Pat. Nos. 3,971,065, 3,982,274, 4,054,906 and 4,054,915 and the references cited therein.

The following example is presented.

EXAMPLE

A 3-color filter array was prepared on the surface of a silicon wafer. The color filter array was formed using the following solutions:

Photosensitive Dyeable Composition Solution

An amount of 25 g of Norland TM photoengraving glue in 20 ml of water was mixed with 8 g of a 20% aqueous solution of ammonium dichromate. The solution had a room-temperature viscosity of about 150 centipoise.

Green Solution

An amount of 1.5 g of Remazol TM Brilliant Green 6B and 1.5 g of Drimarene TM Brilliant Yellow K-3GL were dissolved in 100 ml of water. The pH was adjusted to 3.5 with dilute hydrochloric acid. Remazol TM Brilliant Green 6B is a copper phthalocyanine dye having a sulfato ethyl sulfanyl reactive group.

Red Solution

An amount of 2 g of Drimarene TM Scarlet R-3G was dissolved in 100 ml of water and the pH was adjusted to 2.0 with dilute hydrochloric acid. Drimarene TM Scarlet R-3G is an azo dye having a trichloropyrimidinyl reactive group.

Blue Solution

An amount of 2 g of Procion TM Blue MX-G was mixed with 100 ml of water and the pH was adjusted to 3.0 with dilute hydrochloric acid. Procion TM Blue MX-G is an oxazene dye having a dichlorotrizinyl reactive group.

Solution Containing the Metal Salt of the Long-Chain Fatty Acid

An amount of 5.88 g of Quilon C ® was dissolved in 95 ml of water. The pH was adjusted to about 4.0 with concentrated ammonium hydroxide.

A 3-color filter array was prepared using the above solutions in the following manner:

Step 1

A silicon wafer was spin-coated with the layer of the photosensitive dyeable composition.

Step 2

The coated wafer was placed in a mask aligner and exposed through a positive mask representing the desired set of red color filter elements. The exposure was made with a mercury vapor lamp.

Step 3

The layer of the photosensitive dyeable composition was developed by running the layer under water and spin-drying on the spin coater. The result was a wafer which had islands of dyeable composition which corresponded to the desired red color filter array.

Step 4

The developed wafer was immersed in the red dye solution for about 1 min. The wafer was then rinsed under running water and dried by spinning on the spin coater.

Step 5

The wafer was then immersed in the solution containing the metal salt of the long-chain fatty acid for about 15 sec, rinsed under running water and spin-dried on the spin coater. The wafer was then dried in a drying oven at 100°-110° C. for about 10 min.

Steps 6-10

Steps 1-5 were repeated except that the blue color mask was used in the exposure step and the blue dye solution was used in the dyeing step.

Steps 11-14

Steps 1-4 were repeated except that the green color mask was used in the exposure step and the green dye solution was used in the dyeing step.

The result was a solid-state color imaging device with an excellent-quality color filter array.

Although the invention has been described in considerable detail with particular reference to certain preferred embodiments thereof, variations and modifications can be effected within the spirit and scope of the invention.

I claim:

1. A color imaging device comprising a support having a radiation-sensitive surface having superimposed thereon a color filter array having at least two sets of filter elements wherein at least one of said filter elements comprises a dyed element of a dyeable composition wherein:

said dyeable composition comprises at least one compound having coordination sites for metal ions and the outermost surface of the elements of at least one set of filter elements comprises a metal salt of a long-chain fatty acid wherein the metal of the salt is coordinated to said coordination sites in said dyeable composition.

2. A color imaging device according to claim 1 wherein said dyeable composition comprises a dichromated hydrophilic colloid.

3. A color imaging device according to claim 2 wherein said hydrophilic colloid is gelatin.

4. A color imaging device according to claim 3 wherein said gelatin is dyed with a reactive dye.

5. A color imaging device according to claim 1 wherein the metal of said metal salt of a long-chain fatty acid is chromium.

6. A color imaging device according to claim 1 wherein the long-chain fatty acid of said metal salt of a long-chain fatty acid is selected from the group consisting of myristic and stearic acid.

7. A color imaging device according to claim 1 wherein said support having a radiation-sensitive surface is a solid-state imaging device.

8. A method of producing a color imaging device comprising a support having a radiation-sensitive surface having superimposed thereon a color filter array having at least two sets of filter elements wherein at least one of said filter elements comprises a dyed element of a dyeable composition, said method comprising the steps of:

(a) forming on said surface a layer of a radiation-sensitive dyeable composition which comprises at least one compound having coordination sites for metal ions;

(b) exposing and developing said radiation-sensitive dyeable composition in order to form elements of the composition corresponding to a set of filter elements;

(c) dyeing said elements to form dyed filter elements; and (d) contacting the surface of the dyed filter elements with a metal salt of a long-chain fatty acid;

and forming a second set of filter elements by repeating steps (a), (b) and (c).

9. The method of producing a color imaging device according to claim 8 wherein a three-color filter array is produced by performing steps (a) through (d) to form a first set of filter elements of a first color, repeating steps (a) through (d) to form a second set of filter elements of a second color, and then repeating steps (a) through (c) to produce a third set of filter elements of a third color.

10. The method of either of claims 8 or 9 wherein step (c) is performed at least once by immersing the elements in a water solution of a reactive dye.

11. The method of either of claims 8 or 9 wherein step (d) is performed by immersing the dyed filter elements in a water solution comprising said metal salt of a long-chain fatty acid.

12. The method of either of claims 8 or 9 wherein said radiation-sensitive dyeable composition comprises a dichromated hydrophilic colloid.

13. The method of either of claims 8 or 9 wherein the metal of said metal salt of a long-chain fatty acid is chromium.

14. The method of either of claims 8 or 9 wherein said support having a radiation-sensitive surface is a solid-state imaging device.

* * * * *